(12) United States Patent
Wang et al.

(10) Patent No.: US 9,414,506 B2
(45) Date of Patent: Aug. 9, 2016

(54) APPARATUS FOR CONTROLLING OPENING HOLE AND ELECTRONIC EQUIPMENT HAVING APPARATUS FOR CONTROLLING OPENING HOLE

(71) Applicant: BOE TECHNOLOGY GROUP CO., LTD., Beijing (CN)

(72) Inventors: Zifeng Wang, Beijing (CN); Yan Ren, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 16 days.

(21) Appl. No.: 14/315,485

(22) Filed: Jun. 26, 2014

(65) Prior Publication Data
US 2015/0282348 A1 Oct. 1, 2015

(30) Foreign Application Priority Data

Mar. 28, 2014 (CN) .......................... 2014 1 0124113

(51) Int. Cl.
| | | |
|---|---|---|
| H05K 5/02 | (2006.01) | |
| H05K 7/20 | (2006.01) | |
| H05K 5/00 | (2006.01) | |

(52) U.S. Cl.
CPC ............ *H05K 5/0213* (2013.01); *H05K 5/0056* (2013.01); *H05K 7/20181* (2013.01); *H05K 7/20954* (2013.01)

(58) Field of Classification Search
CPC . H05K 7/20; H05K 7/20136; H05K 7/20145; H05K 7/20181; H05K 7/20954; H05K 7/20972; H05K 5/0004; H05K 5/0056; H05K 5/0065; H05K 5/0213; H05K 5/02; G06F 1/181; G06F 1/182; G06F 1/20; G05D 23/1393; G05D 23/185; G05D 23/1854; G05D 23/19; G05D 23/1925
See application file for complete search history.

(56) References Cited

U.S. PATENT DOCUMENTS 5,443,420 A * 8/1995 Kim et al. ..................... 454/256
7,031,154 B2 * 4/2006 Bash et al. .................... 361/690
(Continued)

FOREIGN PATENT DOCUMENTS

| CN | 2677968 Y | 2/2005 |
|---|---|---|
| CN | 1960617 A | 5/2007 |

(Continued)

OTHER PUBLICATIONS

First Office Action regarding Chinese application No. 201410124113.2, dated Feb. 2, 2016. Translation provided by Dragon Intellectual Property Law Firm.

*Primary Examiner* — Andrew Roersma
(74) *Attorney, Agent, or Firm* — Harness, Dickey & Pierce, P.L.C.

(57) ABSTRACT

An apparatus for controlling an opening hole and an electronic equipment having the apparatus for controlling an opening hole. The apparatus is used for the electronic equipment, a case of the electronic equipment is provided with meshes penetrating the case, wherein the apparatus comprises: movable block sheets; a drive mechanism, configured to control the block sheets to switch between a first state blocking the meshes and a second state exposing the meshes. By the setting of the movable block sheets, the apparatus has the first state blocking the meshes of the electronic equipment and the second state exposing the meshes, when the electronic equipment is in use, the blocking sheets may be in the second state to ensure the electronic equipment to operate normally; when it is not in use, the blocking sheets may be in the first state to prevent the foreign matter from invading the electronic equipment.

13 Claims, 9 Drawing Sheets

(56) References Cited

U.S. PATENT DOCUMENTS

| | | | |
|---|---|---|---|
| 7,466,546 B2 * | 12/2008 | Park | 361/695 |
| 8,369,084 B2 * | 2/2013 | Chen et al. | 361/679.55 |
| 8,601,740 B2 * | 12/2013 | Tu et al. | 49/92.1 |
| 2005/0168942 A1 * | 8/2005 | Steinbrecher | 361/690 |
| 2007/0053143 A1 * | 3/2007 | Kang | 361/678 |
| 2008/0089035 A1 * | 4/2008 | Ye et al. | 361/724 |
| 2009/0086430 A1 * | 4/2009 | Kang et al. | 361/695 |
| 2010/0182748 A1 * | 7/2010 | Huang | 361/690 |
| 2011/0303688 A1 * | 12/2011 | Chen et al. | 220/694 |
| 2012/0075803 A1 * | 3/2012 | Kobayashi | 361/695 |
| 2013/0099647 A1 * | 4/2013 | Wang et al. | 312/327 |

FOREIGN PATENT DOCUMENTS

| | | | | |
|---|---|---|---|---|
| CN | 201348852 Y | * | 11/2009 | G05B 19/04 |
| CN | 202350213 U | * | 7/2012 | F24F 1/58 |
| CN | 203470412 U | * | 3/2014 | B08B 17/04 |
| JP | H04230097 A | * | 8/1992 | H05K 7/20 |
| TW | 200530791 A | | 9/2005 | |

* cited by examiner

APPARATUS FOR CONTROLLING OPENING HOLE AND ELECTRONIC EQUIPMENT HAVING APPARATUS FOR CONTROLLING OPENING HOLE

CROSS-REFERENCE TO RELATED APPLICATION

The present application claims a priority of the Chinese patent application No. 201410124113.2 filed on Mar. 28, 2014, which is incorporated herein by reference in its entirety.

TECHNICAL FIELD

The invention relates to electronic equipment technology, particularly refers to an apparatus for controlling an opening hole and an electronic equipment having the apparatus for controlling an opening hole.

BACKGROUND

To ensure the normal usage of electronic products or extend the useful life thereof, a certain number of functional holes, such as cooling holes, vent and sound holes of horn or the like, must be kept on the appearance structure of the corresponding electronic products.

However, in the statistics about the using time of the electronic products, such as the average daily usage rate of TV or display is less than ⅓, furthermore, some electronic products are only used at specific time. When the electronic products are not in use, the function of the electronic product itself is in a substantial closed state, these functional meshes will lose the original design meaning but become a channel for foreign matter such as dust, moisture and mosquitoes or the like to invade, thereby the usage life of the product is reduced in a certain extent.

The design to the functional meshes of the electronic products in the current market usually intends to decrease the size of the mesh itself and try to not destroy the appearance in the premise of meeting the function, but the two are often in inverse ratio, that is, the mesh is bigger, then the corresponding function thereof is better, whereas the foreign matter can be more easily to invade, meanwhile, it is more unfavorable for a complete appearance, the overall aesthetics of electronic products is affected.

SUMMARY

The purpose of the technical solution according to the present invention is to provide an apparatus for controlling an opening hole and an electronic equipment having the apparatus for controlling an opening hole, used for controlling the open and close of the functional meshes of the electronic equipment, not only the normal operation of the electronic equipment can be ensured, but also the invasion of the foreign matter can be prevented when the electronic equipment is not in use.

The embodiment of the present invention provides an apparatus for controlling an opening hole used for an electronic equipment, a case of the electronic equipment is provided with meshes penetrating the case, wherein the apparatus for controlling an opening hole comprises:

movable block sheets;

a drive mechanism, configured to control the block sheets to switch between a first state that blocking the meshes and a second state that exposing the meshes.

Alternatively, for the above apparatus for controlling an opening hole, wherein the electronic equipment has a power source, the drive mechanism comprises an electrically driven structure and a revert structure, the apparatus for controlling an opening hole further comprises:

a power supply interface, connected to the power source and configured to supply power to the electrically driven mechanism in the state that the power source is on, so that the drive mechanism drives the block sheets to move from the first state that blocking the meshes to the second state that exposing the meshes;

the revert structure is configured to generate an acting force to enable the block sheets to revert to the first state when the power source is off.

Alternatively, for the above apparatus for controlling an opening hole, wherein the apparatus for controlling an opening hole further comprises an outer frame having a plurality of perforations;

a slider connected to the outer frame and configured to translate with respect to the outer frame, wherein the block sheets are disposed on the slider, when the slider is in a first position with respect to the outer frame, the block sheets are in the first state, each of the block sheets correspondingly blocks one perforation; when the slider moves from the first position to a second position with respect to the outer frame, the block sheets are driven to move from the first state to the second state, so that the perforations are exposed.

Alternatively, for the above apparatus for controlling an opening hole, wherein in the first state, the block sheets are tiled, in which the block sheets are connected successively; in the second state, the block sheets are in a furled state, in which an interval is provided between adjacent block sheets.

Alternatively, for the above apparatus for controlling an opening hole, wherein the slider comprises two guide grooves parallel to each other, and the two guide grooves are correspondingly disposed on the two opposing sides of the outer frame, the perforations are disposed between the two guide grooves; a tooth rail is disposed on one surface of the guide grooves along the length direction of the guide grooves;

the two sides of the block sheets are connected to a positioning rod and a scroll respectively, the positioning rod is fixedly disposed on the guide grooves, the outer surface of the scroll is in a tooth shape and matched and connected with the tooth rail;

wherein the slider is translated along the length direction of the guide grooves, and acts between the first position and the second position, the scroll is driven to scroll on the rail, to act between the first state and the second state.

Alternatively, for the above apparatus for controlling an opening hole, wherein a plurality of perforations have the same size and shape and are parallel to each other, the size of the block sheets in the first state corresponds to the size of the perforations.

Alternatively, for the above apparatus for controlling an opening hole, wherein the electrically driven structure comprises:

a metal connector connected to the block sheets;

an electromagnet disposed on one side of the metal connector, the electromagnet has a predetermined distance away from the metal connector, the block sheets act between the first state and the second state via the metal connector being absorbed and loosen by the electromagnet.

Alternatively, for the above apparatus for controlling an opening hole, wherein the revert structure comprises:

a spring connected to the metal connector and disposed between the metal connector and the electromagnet, the electromagnet absorbs the metal connector, the spring is extruded, the electromagnet looses the metal connector, the action force is generated to revert the block sheets to the first state under the effect of the elastic restoring force of the spring.

Alternatively, for the above apparatus for controlling an opening hole, wherein the bottom surface of the outer frame has a displacement space, the electromagnet is disposed in the displacement space and is located on the side away from the perforations.

Alternatively, for the above apparatus for controlling an opening hole, wherein the apparatus for controlling an opening hole further comprises a case chip, the case chip has a closing portion and an opening portion, the case chip is covered on the outer frame, the closing portion corresponds to the displacement space of the outer frame, the opening portion corresponds to the portion of the outer frame having the perforations, the electromagnet and the spring are closed by the combination of the closing portion and the upper surface of the displacement space.

Alternatively, for the above apparatus for controlling an opening hole, wherein the power supply interface comprises a control switch connected to the power source.

Alternatively, for the above apparatus for controlling an opening hole, wherein the apparatus for controlling an opening hole further comprises a paste film layer for pasting the outer frame to the case of the electronic equipment.

The embodiment of the present invention further provides another apparatus for controlling an opening hole, used for an electronic equipment, the electronic equipment comprises a case, the case has an accommodation space, wherein the apparatus for controlling an opening hole comprises:

movable block sheets disposed in the accommodation space, having a first state that closing the accommodation space and a second state that enabling a port for communication between the accommodation space and the outside;

a drive mechanism, configured to control the block sheets to switch between the first state that blocking meshes and the second state that exposing meshes.

Alternatively, for the above apparatus for controlling an opening hole, wherein the electronic equipment has power source, the drive mechanism comprises an electrically driven structure and a revert structure, the apparatus for controlling an opening hole further comprises:

a power supply interface, connected to the power source and configured to supply power to the electrically driven mechanism in the state that the power source is on, so that the drive mechanism drives the block sheets to move from the first state that blocking the meshes to the second state that exposing the meshes;

the revert structure is configured to generate an acting force to enable the block sheet to revert to the first state when the power source is off.

The embodiment of the present invention further provides an electronic equipment, a case of the electronic equipment is provided with meshes penetrating the case, the apparatus for controlling an opening hole as mentioned above is disposed on one side of the meshes.

At least one of the above technical solutions according to the present invention has the following beneficial effects:

By the setting of the block sheets, the present invention has the first state that blocking the meshes of the electronic equipment and the second state that exposing the meshes. When the electronic equipment is in use, the blocking sheets may be in the second state to ensure the electronic equipment to operate normally; when the electronic equipment is not in use, the blocking sheets may be in the first state to prevent the foreign matter from invading the electronic equipment.

DETAILED DESCRIPTION

To make the problems to be solved, technical solutions and advantages of the present invention more clearly, it will be described in detail with reference to the annexed drawings and the embodiments.

The apparatus for controlling an opening hole according to the embodiments of the present invention is used for an electronic equipment, a case of the electronic equipment is provided with meshes penetrating the case, the apparatus for controlling an opening hole comprising:

movable block sheets;

a drive mechanism, configured to control the block sheets to switch between a first state that blocking the meshes and a second state that exposing the meshes.

By the setting of the movable block sheet, the apparatus for controlling an opening hole is enabled to have the first state that blocking the meshes of the electronic equipment and the second state that exposing the meshes. When the electronic equipment is in use, the blocking sheets may be in the second state to ensure the electronic equipment to operate normally; when the electronic equipment is not in use, the blocking sheets may be in the first state to prevent the foreign matter from invading the electronic equipment.

Excellently, the apparatus for controlling an opening hole according to the embodiments of the present invention, the electronic equipment has a power source, the drive mechanism of the apparatus for controlling an opening hole comprises an electrically driven structure and a revert structure, the apparatus for controlling an opening hole further comprises:

a power supply interface, connected to the power source and configured to supply power to the drive mechanism in the state that the power source of the electronic equipment is on, so that the drive mechanism drives the block sheets to move from the first state that blocking the meshes to the second state that exposing the meshes.

The revert structure is configured to generate an acting force to enable the block sheets to revert to the first state.

By connecting the power supply interface to the power source of the electronic equipment, when the power source of the electronic equipment is on, the drive mechanism obtains the power, the block sheets are driven to move to the second state that exposing the meshes, which ensures the normal operation of the electronic equipment; and by using the above revert structure, when the power source of the electronic equipment is off, the block sheets are automatically reverted to the first state that blocking the meshes. In such way, the control for opening and closing the meshes is achieved by the power source of the electronic equipment, the state of the meshes is adapted to the operate state of the electronic equipment, thus no additional operation is needed, it is simple and convenient.

Specially, the electrically driven structure may use electromagnet structure to achieve the action control to the block sheets, the electrically driven structure comprises:

a metal connector connected to the block sheets;

an electromagnet disposed on one side of the metal connector, the electromagnet has a predetermined distance away from the metal connector, the block sheets act between the first state and the second state via the metal connector being absorbed and loosen by the electromagnet.

The revert structure comprises:

a spring connected to the metal connector and disposed between the metal connector and the electromagnet, the electromagnet absorbs the metal connector, the spring is extruded, the electromagnet looses the metal connector, the action force is generated to revert the block sheets to the first state under the effect of the elastic restoring force of the spring.

The apparatus for controlling an opening hole may use the matching structure of the electromagnet and the spring so that for the opening and closing of the meshes are controlled when the power source of the electronic equipment is connected and disconnected.

The above embodiment is only an exemplary description, the persons in skilled can achieve the connection between the apparatus for controlling an opening hole and the power source of the electronic equipment with various implement structures according to the principle of the present invention.

Furthermore, the apparatus for controlling an opening hole according to the embodiment of the present invention may be used by directly covering the meshes of the electronic equipment, so that the opening and closing of the meshes are controlled.

Figure 1:
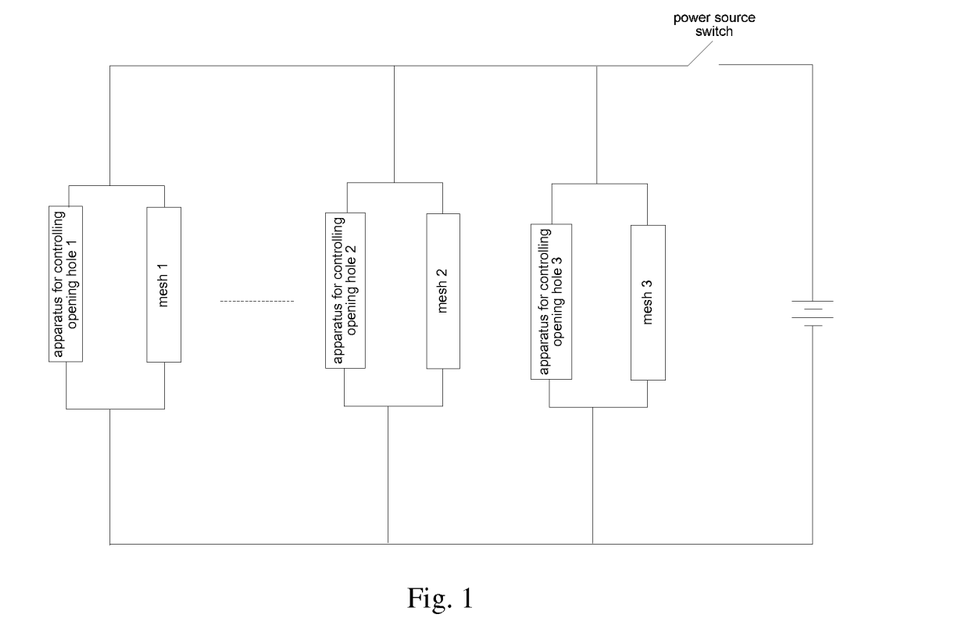
FIG. 1 is a circuit connection view of an electronic equipment having a plurality of the apparatuses for controlling an opening hole according to the present invention.
Figure 2:
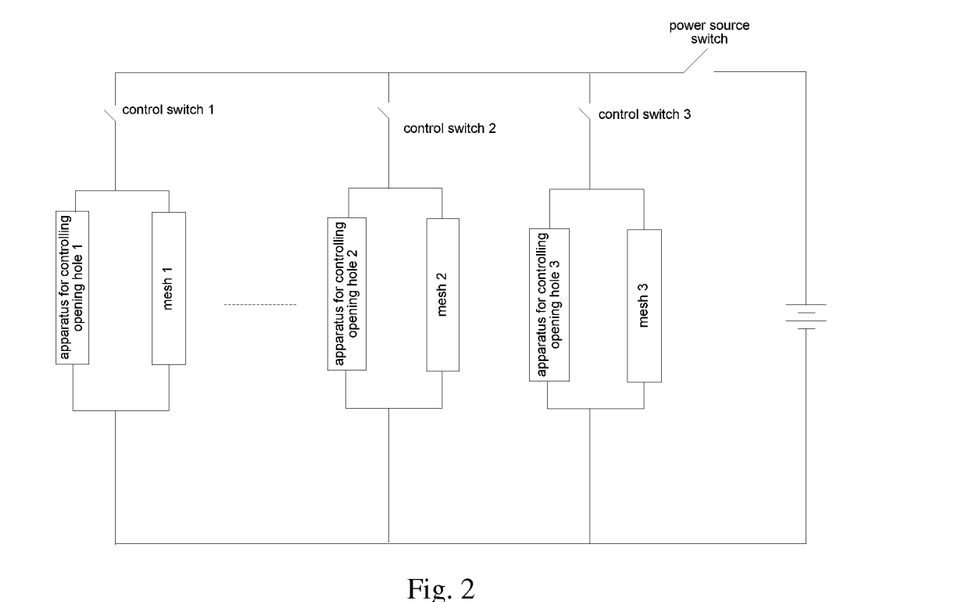
FIG. 2 is another circuit connection view of the electronic equipment having a plurality of the apparatuses for controlling an opening hole according to the present invention.

The persons in the skilled may understand that the electronic equipment usually has a plurality of functional meshes, such as cooling holes, vent and sound holes of horn or the like, in which each mesh may be provided with one apparatus for controlling an opening hole respectively, each apparatus for controlling an opening hole is covered on the functional mesh respectively, the circuit connection may be the structure as shown in FIG. 1, all the apparatuses for controlling an opening hole are connected to the power switch of the electronic equipment, when the power switch is on, all the apparatuses for controlling an opening hole make the block sheets thereof in the second state to close the corresponding mesh; when the power switch is off, all the apparatuses for controlling an opening hole make the block sheets thereof in the first state to close the corresponding mesh. In addition, the circuit connection between each apparatus for controlling an opening hole may also be the structure shown in FIG. 2, in which an independent control switch is further disposed between each apparatus for controlling an opening hole and the power switch of the electronic equipment in addition to each apparatus for controlling an opening hole being connected to the power switch of the electronic equipment respectively, each apparatus for controlling an opening hole independently controls the state of the corresponding mesh respectively, thus during the use of electronic equipment, when one of the meshes is not used, this mesh can be closed by manual control, for example, during the use of the electronic equipment, if there is no need to use the sound hole of horn to broadcast sound, the sound hole of horn can be closed, but the other functional meshes such as cooling holes are in the normally opened state.

Hereinafter, the specific structure of the apparatus for controlling an opening hole of the present invention will be described in details.

Figure 3:
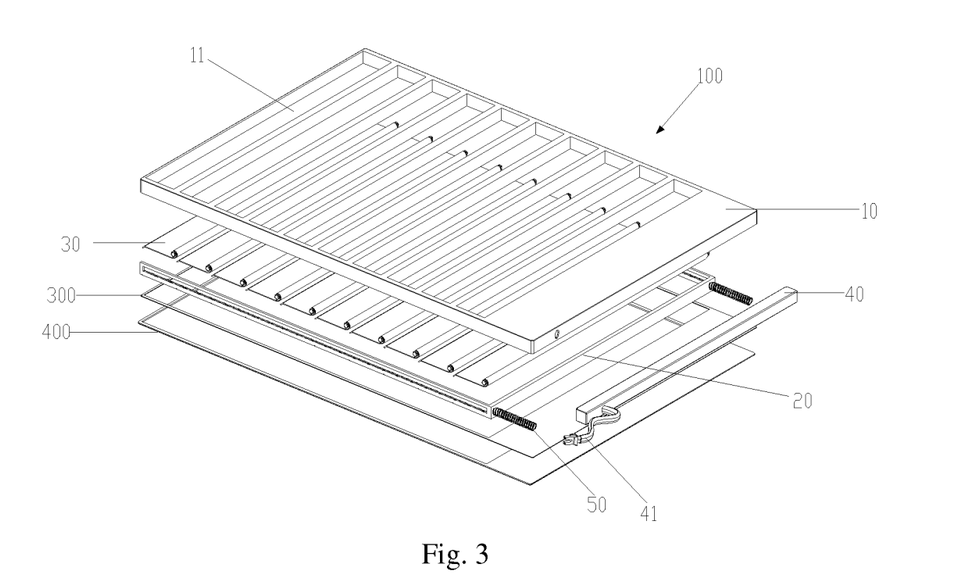
FIG. 3 is an exploded structural schematic view of the apparatus for controlling an opening hole according to the embodiment of the present invention.

FIG. 3 is an exploded structural schematic view of the apparatus for controlling an opening hole according to the embodiment of the present invention, as shown in FIG. 3, the apparatus 100 for controlling an opening hole comprises an outer frame 10, a metal slider 20 assembled to the outer frame 10, and a plurality of block sheets 30.

In which, the outer frame 10 has a rectangular shape and forms with a plurality of perforations 11 parallel to each other.

The metal slider 20 is connected to the outer frame 10 and can be translated with respect to the outer frame 10, in which the block sheets 30 are disposed on the metal slider 20, when the metal slider 20 are in the first state with respect to the outer frame 10, the block sheet 30 is in the first state, each block sheet 30 correspondingly blocks one perforation 11. When the metal slider 20 moves from the first position to the second position with respect to the outer frame 10, the block sheet 30 is driven to move from the first state to the second state to expose the perforations 11.

Figure 5:
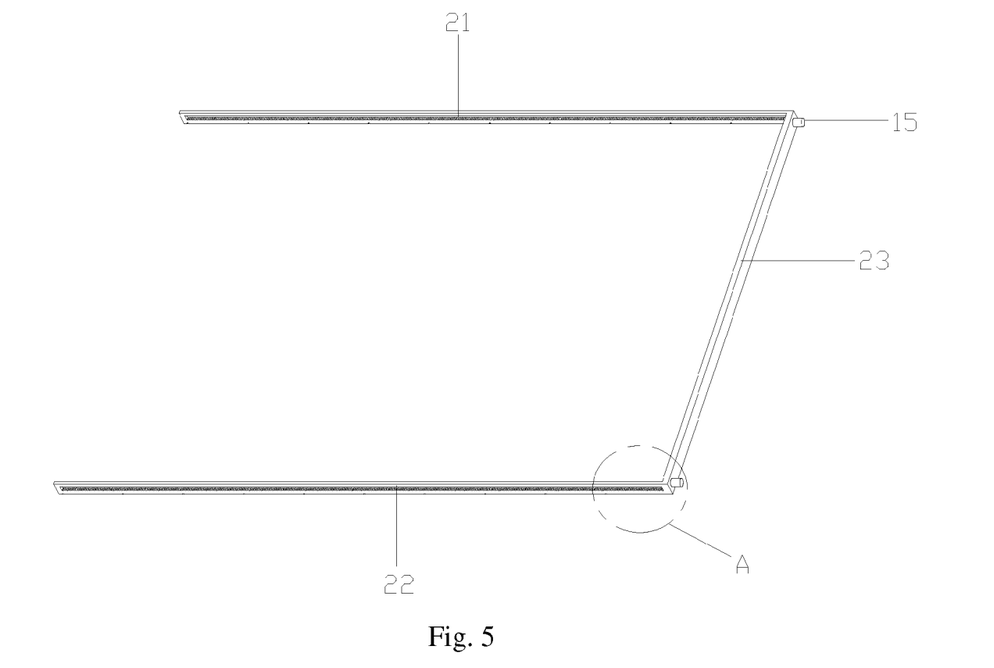
FIG. 5 is a structural schematic view of a metal slider of the apparatus for controlling an opening hole according to the present invention.
Figure 6:
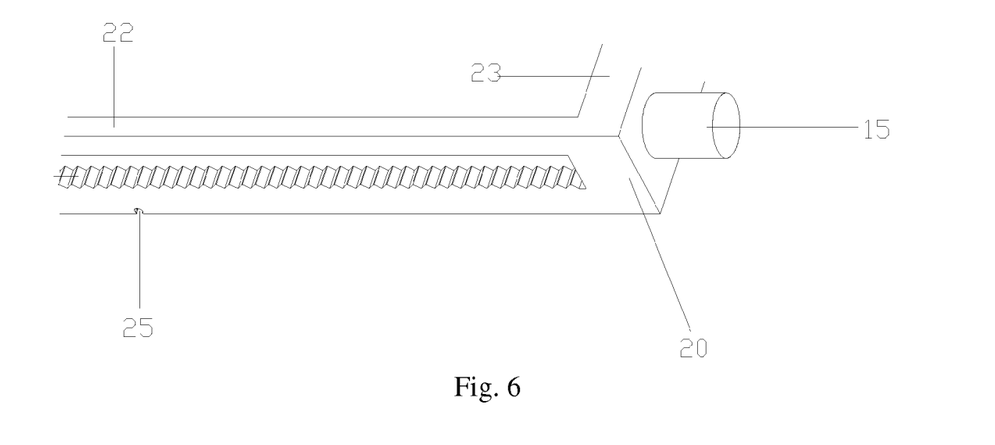
FIG. 6 is an enlarged structural schematic view of part A of FIG. 5.
Figure 10:
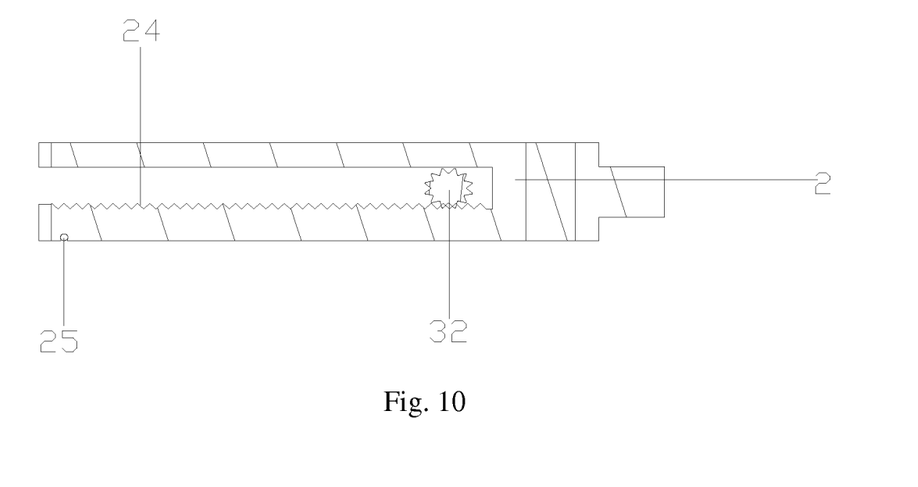
FIG. 10 is a cross sectional view of part C-C of FIG. 9.

As shown in FIG. 5, the metal slider 20 comprises: a first guide groove 21 and a second guide groove 22 which are parallel to each other, and a connect rod 23 connected to the first guide groove 21 and the second guide groove 22, the connect rod 23 is vertical disposed with respect to the first guide groove 21 and the second guide groove 22 respectively, the first guide groove 21, the second guide groove 22 and the connect rod 23 are formed in a "Π" shape. In addition, as shown in FIG. 6 and FIG. 10, one surface of the first guide groove 21 and one surface of the second guide groove 22 is provided with a tooth rail 24 along the length direction of the first guide groove 21 and the second guide groove 22, the other surface opposite to the tooth rail 24 is a smooth surface. In addition, a plurality of positioning holes 25 are disposed on the bottom surface of the tooth rail 24 at intervals.

Figure 7:
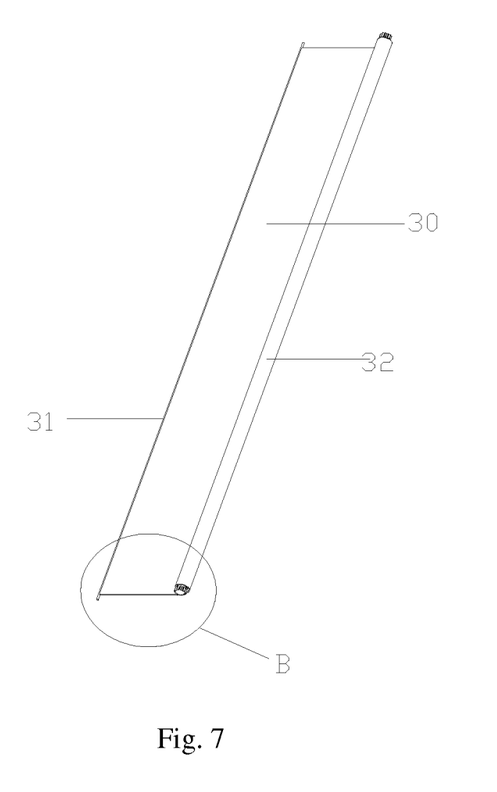
FIG. 7 is a structural schematic view of the block sheets of the apparatus for controlling an opening hole according to the present invention.
Figure 8:
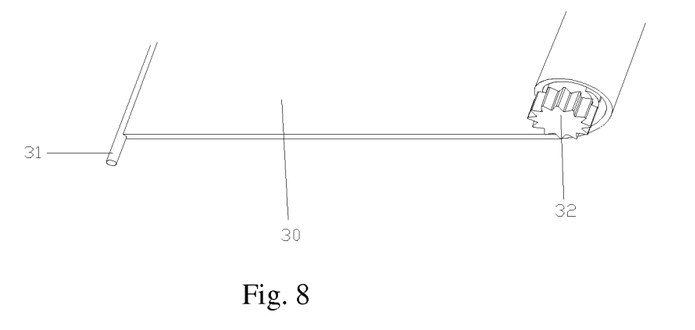
FIG. 8 is an enlarged structural schematic view of part B of FIG. 7.

As shown in FIG. 7 and FIG. 8, the block sheets 30 are in membranous structure being capable of curling, the opposed sides thereof are connected to a positioning rod 31 and a scroll 32 respectively, and the lengthes of these opposed sides are equal to the distance between the first guide groove 21 and the second guide groove 22, the positioning rod 31 and the scroll 32 are overlapped on the first guide groove 21 and the second guide groove 22 respectively. Further, the outer surface of the scroll 32 is formed in a tooth shape.

Figure 9:
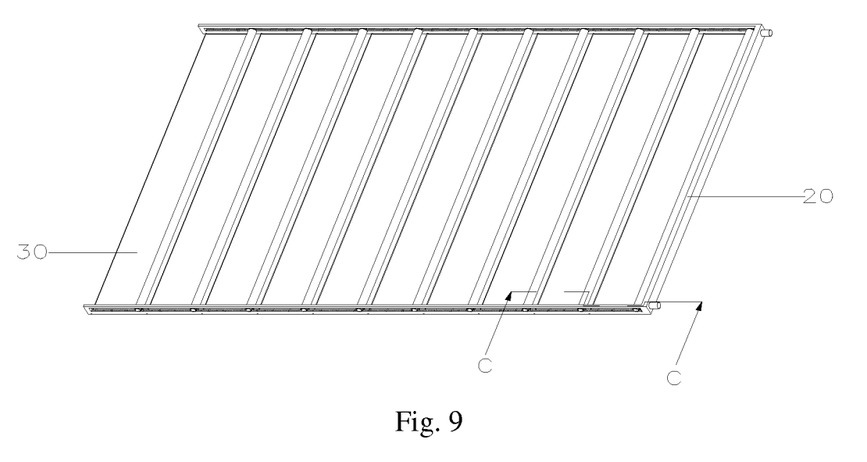
FIG. 9 is a structural schematic view showing assembling of the metal slider and a outer frame in the apparatus for controlling an opening hole according to the present invention.
Figure 11:
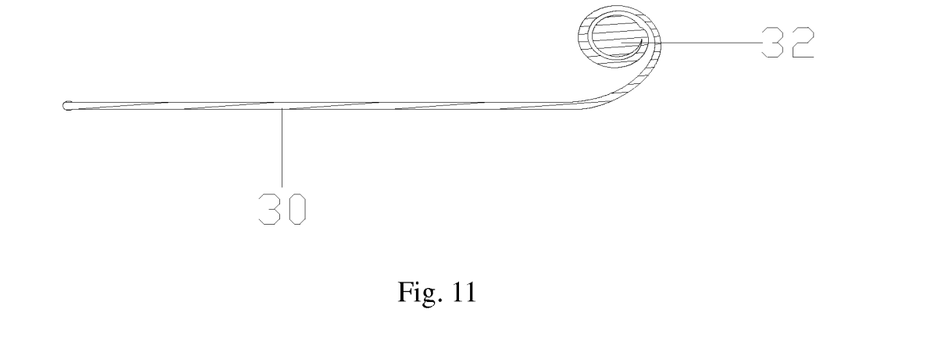
FIG. 11 is a cross sectional view of the block sheets in the apparatus for controlling an opening hole according to the present invention.

Referring to FIG. 9 and in connection with FIGS. 10 and 11, a plurality of block sheets 30 are successively arranged along the length direction of the first guide groove 21 and the second guide groove 22, in which the positioning rod 31 connected to the block sheet 30 is fixedly engaged in the positioning hole 25, and the scroll 32 connected to the block sheet 30 is matched and connected with the tooth rail 24 by the tooth of the outer surface.

Based on the above structure configuration of the block sheets 30 and the metal slider 20, the block sheets 30 are formed with the first state in which they are tiled and successively connected, and the second state in which they are furled and disposed with at intervals between the adjacent block sheets 30.

Figure 4:
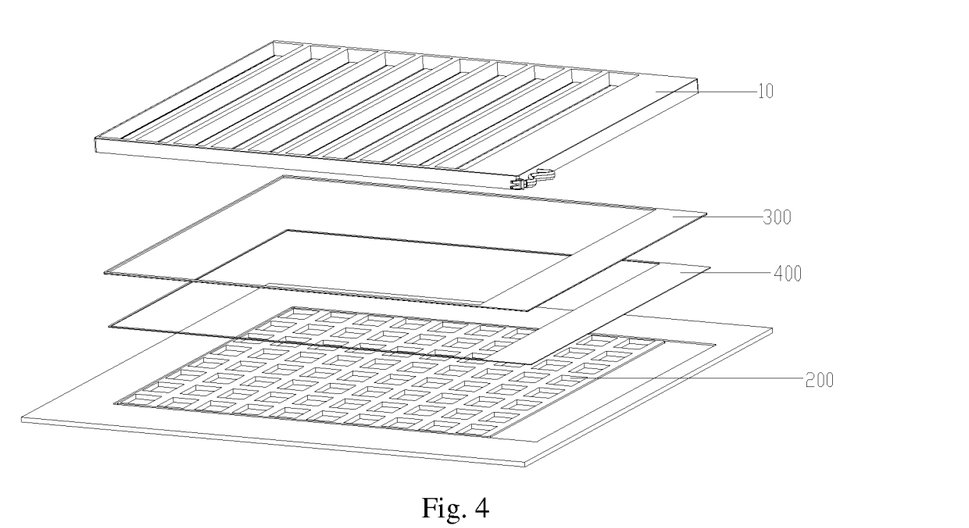
FIG. 4 is a decomposition view showing assembling of the apparatus for controlling an opening hole according to the embodiment of the present invention and a case of the electronic equipment.

As shown in FIG. 3 and FIG. 4, the metal slider 20 connected with the block sheets 30 is assembled with the outer frame 10, the first guide groove 21 and the second guide groove 22 are disposed corresponding to the opposite sides of the outer frame 10 respectively, the perforations 11 of the outer frame 10 are located between the first guide groove 21 and the second guide groove 22, and the perforations 11 have the same size and shape, the size of the block sheets 30 under the tiled first state corresponds to the size of the perforations 11, by means of the perforations 11 being covered by the block sheets 30, the communication between the perforations 11 and the below space of the block sheets 30 is prevented. When the block sheets 30 are in the furled second state, the perforations 11 are exposed, to connect with the below space of the block sheets 30.

By the above assembly configuration of the outer frame 10 and the metal slider 20, when the block sheets 30 are in the tiled first state as shown in FIG. 9, the metal slider 20 brings the block sheets 30 to translate rightward as shown in FIG. 5 with respect to the outer frame 10, because one side of the block sheets 30 is fixedly engaged in the positioning hole 25 by the positioning rod 31 and the other side is matched and connected with the tooth tail 24 by the scroll 32, with the block sheets 30 moving along with the metal slider 20 rightward, the scroll 32 is scrolled in the direction to scroll the block sheets 30, so that the perforations 11 are opened. Similarly, when the block sheets 30 are in the furled second state, the metal slider 20 brings the block sheets 30 to translate leftward as shown in FIG. 5 with respect to the outer frame 10, with the block sheets 30 moving along with the metal slider 20 leftward, the scroll 32 is scrolled in the direction to open the block sheets 30 to be tiled, so that the perforations 11 are closed.

Therefore, according to the apparatus 100 for controlling an opening hole formed by the combination of the outer frame 10 and the metal slider 20, when the apparatus 100 for controlling an opening hole is disposed on one side of the meshes 200 in the case of the electronic equipment and these meshes 200 are covered, the block sheets 30 act between the first state and the second state by means of the translation of the metal slider 20, the perforations 11 of the outer frame 10 are closed or opened, thereby the functional meshes 200 are closed or opened accordingly.

Further, as shown in FIG. 3, in the apparatus 100 for controlling an opening hole according to the embodiment of the present invention, the drive mechanism used for driving the metal slider 20 to move comprises an electromagnet 40, which is disposed on one side of the metal slider 20 and is connected to the power source of the electronic equipment via a cable 41 (also i.e. power interface), and the power source supplies power to the electromagnet 40. When energy has been obtained by the electromagnet 40 from the electronic equipment via the cable 41, magnetic force will be generated to attract the metal slider 20 to move.

In addition, the apparatus 100 for controlling an opening hole further comprises a revert structure, which is used for enabling the metal slider 20 to bring the block sheets 30 to revert to the first state after the outage of the electromagnet 40 when the power source is off. In this embodiment, the revert structure comprises a spring 50 disposed between the electromagnet 40 and the metal slider 20, when the electromagnet 40 absorbs the metal slider 20, the spring 50 is extruded, when the electromagnet 40 looses the metal slider 20, action force is generated to translate the metal slider 20 to the initial position under the effect of the elastic restoring force of the spring 50, thereby the block sheets 30 are driven to revert to the first state.

Figure 12:
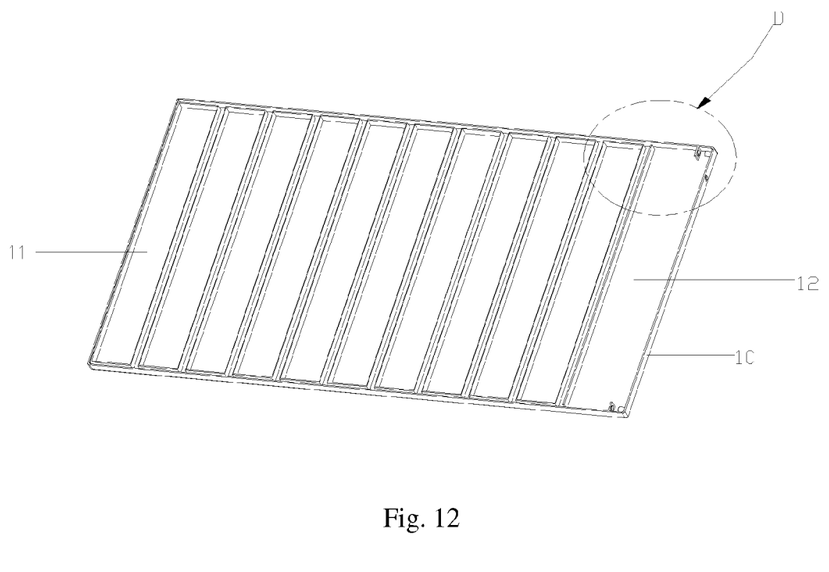
FIG. 12 is a structural schematic view of the outer frame in the apparatus for controlling an opening hole according to the present invention.
Figure 13:
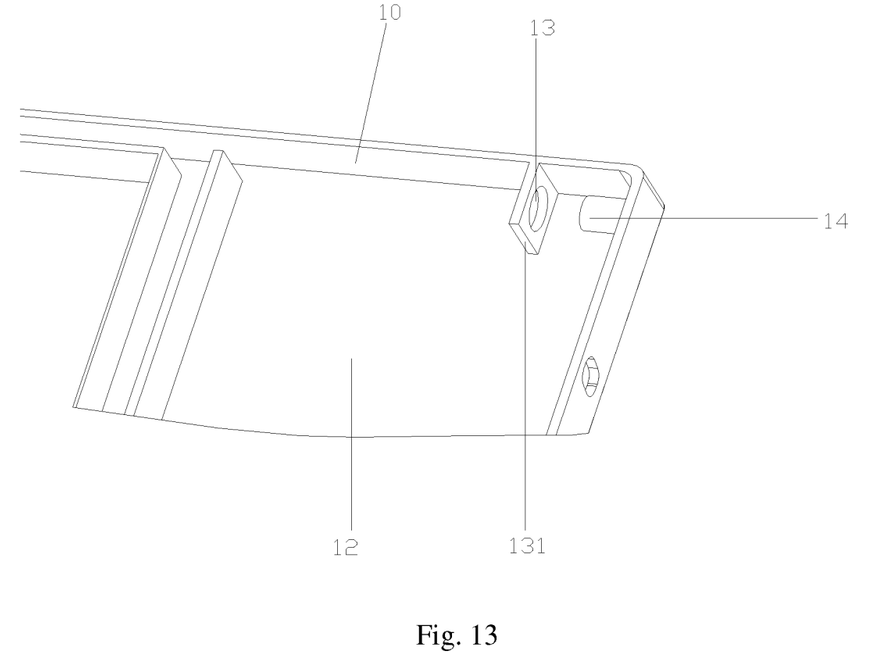
FIG. 13 is an enlarged structural schematic view of part D of FIG. 12.
Figure 14:
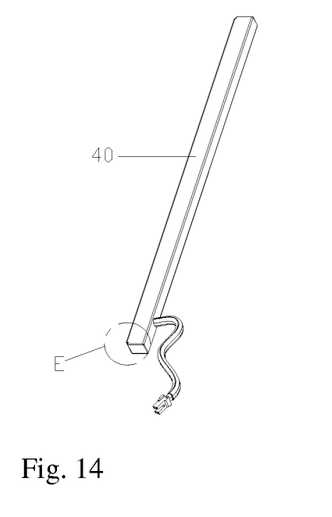
FIG. 14 is a structural schematic view of an electromagnet in the apparatus for controlling an opening hole according to the present invention.
Figure 15:
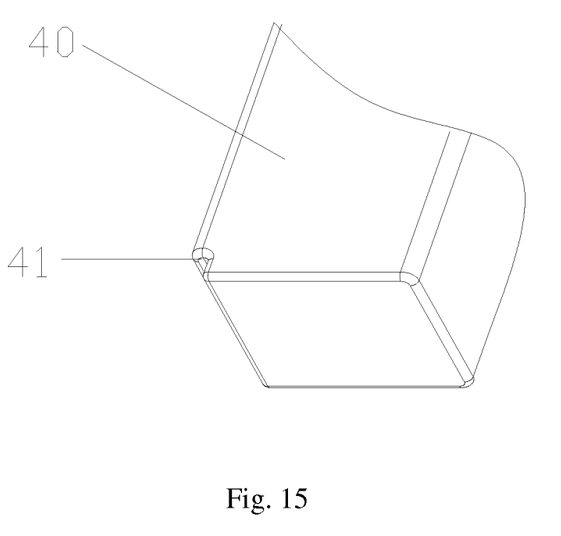
FIG. 15 is an enlarged structural schematic view of part E of FIG. 14.
Figure 16:
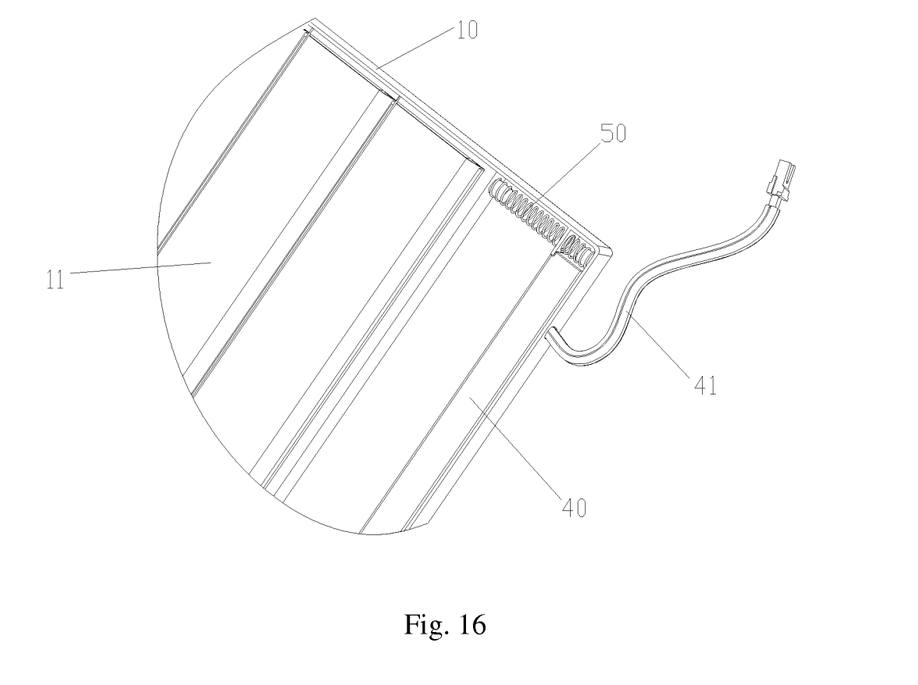
FIG. 16 is a partly structural schematic view showing assembling of the outer frame, the metal slider, the spring and the electromagnet.

As shown in FIG. 12 and FIG. 13, the bottom surface of the outer frame 10 has a displacement space 12, the electromagnet 40 is disposed in the displacement space 12 and is located on the side away from the perforations 11. In addition, a spring positioning hole 13 and a spring positioning column 14 are disposed in the displacement space 12, the spring positioning hole 13 is disposed on a projecting positioning member 131 located at the corner of the displacement space 12, and a spring positioning hole 13 and a spring positioning column 14 are also disposed at the opposite corner. As shown in FIGS. 14 and 15, grooves 41 are disposed on the two sides of the electromagnet 40 respectively, when the electromagnet 40 is installed inside the groove 41, the projecting positioning member 131 is engaged with the groove 41 for positioning.

As shown in FIG. 5 and FIG. 6, the connect rod 23 of the metal slider 20 is also vertically provided with two spring positioning columns 15. When the metal slider 20 is assembled on the outer frame 10, the spring positioning column 15, the spring positioning hole 13 and the spring positioning column 14 are located in the same line, the spring 50 passes through the spring positioning hole 13 with its two ends respectively disposed on the spring positioning columns 15 and the spring positioning column 14 for positioning.

Additionally, when the metal slider 20 is assembled on the outer frame 10, the outer surface of the connect rod 23 corresponds to the position of a limit wall of the outer frame 10, and there is a distance interval from the electromagnet 40, this distance interval is formed as the translation distance of the metal slider 20.

As shown in FIG. 4 and FIG. 5, alternatively, the apparatus 100 for controlling an opening hole further comprises a case chip 300, the case chip 300 has a closing portion and an opening portion, the case chip 300 is covered on the outer frame 10, the closing portion corresponds to the displacement space 12 of the outer frame 10, the opening portion corresponds to the portion of the outer frame 10 having the perforations, the electromagnet 40 and the spring 50 are closed by the combination of the closing portion and the upper surface of the displacement space 12.

In the apparatus for controlling an opening hole having the above structure of the present invention, as shown in FIG. 12, the movement distance of the metal slider 20 is slightly larger than the diameter of the mesh of the electronic equipment, when the block sheets 30 are driven to move by the metal slider 20, the block sheets 30 are curled or tiled to control the opening and closing of the meshes of the electronic equipment, the specific action processes are that: the electromagnet 40 obtains energy from the power source of the electronic equipment to generate magnetic force, the metal slider 20 is attracted to move in the direction toward the electromagnet 40, and the scroll 32 is scrolled in the direction toward the positioning rod 31 by means of the tooth matched structure between the tooth rail 24 of the metal slider 20 and the scroll 32 of the block sheets 30, the block sheets 30 are in the second state, and the perforations 11 of the outer frame 10 communicate with the meshes 200; when the electromagnet 40 is in outage, the magnetic force is disappeared, the metal slider 20 moves in the direction away from the electromagnet 40, the scroll 32 is opened in the direction away from the positioning rod 31 by means of the tooth match structure between the tooth rail 24 of the metal slider 20 and the scroll 32 of the block sheet 30, the block sheets 30 are in the first state, the perforations 11 of the outer frame 10 is closed with respect to the mesh 200.

Preferentially, as shown in FIG. 4, the apparatus 100 for controlling an opening hole according to the embodiment of the present invention may be connected to the electronic equipment by way of pasting, thus the apparatus for controlling an opening hole may further comprise a paste film layer 400 using double-sided adhesive structure, which is disposed on the case chip 300, when a release liner thereof is stripped, the apparatus 100 for controlling an opening hole can be adhered to the electronic equipment at the position of the corresponding meshes 200, the opening and closing of the meshes 200 are automatically controlled based on the power switch of the electronic equipment, which is easy to use.

Additionally, in addition to the above way of adhesion as being independent from the electronic equipment, the apparatus for controlling an opening hole according to the embodiment of the present invention can also constructed in the structure to be directly disposed on the electronic equipment as long as the size and shape of the perforations on the outer frame correspond to the design requirements of the meshes of the electronic equipment.

Therefore, the present invention further provides another apparatus for controlling an opening hole used for the electronic equipment, the electronic equipment comprises a case, the case has an accommodation space, the apparatus for controlling an opening hole comprises:

movable block sheets disposed in the accommodation space, having a first state that closing the accommodation space and a second state that enabling a port for communication between the accommodation space and the outside;

a drive mechanism, configured to control the block sheets to switch between the first state that blocking the meshes and the second state that exposing the meshes.

Additionally, the electronic equipment has a power source, the drive mechanism comprises an electrically driven structure and a revert structure, the apparatus for controlling an opening hole further comprises:

a power supply interface, connected to the power source and configured to supply power to the electrically driven mechanism in the state that the power source is on, so that the drive mechanism drives the block sheets to move from the first state that blocking the meshes to the second state that exposing the meshes.

The revert structure is configured to generate an acting force to enable the block sheets to revert to the first state.

The specific structure of this apparatus for controlling an opening hole can be referenced to the above description in connection with FIGS. 1 to 14, the repetitious details are removed.

The present invention further provides an electronic equipment having the above apparatus for controlling an opening hole, according to the above, the apparatus for controlling an opening hole can be installed as an independent structure on the electronic equipment for usage, also, the meshes of the electronic equipment can be directly designed as the form constructed by the apparatus for controlling an opening hole, the specific structure may referenced to the above description.

The above are the preferred embodiments of the present invention, it should be pointed out that several improvements and modifications can be made hereto without departing from the spirit of the present invention, and these improvements and modifications are also included in the scope of the present invention.

What is claimed is:

1. An apparatus for controlling an opening hole, the apparatus configured to be used with a case of an electronic equipment that has meshes penetrating the case, wherein the apparatus for controlling an opening hole comprises:

movable block sheets;

a drive mechanism, configured to control the block sheets to switch between a first state in which the meshes are blocked and a second state in which the meshes are exposed;

an outer frame having a plurality of perforations; and a slider connected to the outer frame and configured to translate with respect to the outer frame, wherein the block sheets are disposed on the slider, when the slider is in a first position with respect to the outer frame, the block sheets are in the first state, each of the block sheets correspondingly blocks one perforation; when the slider moves from the first position to a second position with respect to the outer frame, the block sheets are driven to move from the first state to the second state, so that the perforations are exposed;

wherein the slider comprises two guide grooves parallel to each other and a connect rod connected with the two guide grooves, wherein the two guide grooves and the connect rod are in a shape of "Π", and the two guide grooves are correspondingly disposed on two opposing sides of the outer frame, the perforations are disposed between the two guide grooves; and a tooth rail is disposed on one surface of the guide grooves along a length direction of the guide grooves;

wherein two sides of the block sheets are connected to a positioning rod and a scroll respectively, the positioning rod is fixedly disposed on the guide grooves, the outer surface of the scroll is in a tooth shape, and the scroll is connected with the tooth rail in cooperation;

wherein the slider is translated along the length direction of the guide grooves, and moves between the first position and the second position, such that the scroll is driven to scroll on the rail and switch between the first state and the second state.

2. The apparatus for controlling an opening hole according to claim 1, the drive mechanism comprises an electrically driven mechanism and a revert structure, wherein the apparatus for controlling an opening hole further comprises:

a power supply interface, connected to a power source and configured to supply power to the electrically driven mechanism when the power source is on, so that the electrically driven mechanism drives the block sheets to move from the first state in which the meshes are blocked to the second state in which the meshes are exposed;

wherein the revert structure is configured to generate an acting force to enable the block sheets to revert to the first state when the power source is off.

3. The apparatus for controlling an opening hole according to claim 2, wherein the electrically driven structure comprises:
a metal connector connected to the block sheets;
an electromagnet disposed on one side of the metal connector, wherein the electromagnet has a predetermined distance away from the metal connector, the block sheets switch between the first state and the second state via the metal connector being attracted and released by the electromagnet.

4. The apparatus for controlling an opening hole according to claim 3, wherein the revert structure comprises:
a spring connected to the metal connector and disposed between the metal connector and the electromagnet, wherein when the electromagnet attracts the metal connector, the spring is contracted; when the electromagnet releases the metal connector, an action force is generated to revert the block sheets to the first state under the effect of an elastic restoring force of the spring.

5. The apparatus for controlling an opening hole according to claim 3, wherein a bottom surface of the outer frame has a displacement space, the electromagnet is disposed in the displacement space and is located on a side away from the perforations.

6. The apparatus for controlling an opening hole according to claim 5, wherein the apparatus for controlling an opening hole further comprises a case chip, the case chip has a closing portion and an opening portion, the case chip is covered on the outer frame, the closing portion corresponds to the displacement space of the outer frame, the opening portion corresponds to a portion of the outer frame having the perforations, the electromagnet and the spring are closed by a combination of the closing portion and an upper surface of the displacement space.

7. The apparatus for controlling an opening hole according to claim 2, wherein the power supply interface comprises a control switch connected to the power source.

8. The apparatus for controlling an opening hole according to claim 1, wherein in the first state, the block sheets are tiled, in which the block sheets are connected successively; in the second state, the block sheets are in a furled state, in which an interval is provided between adjacent block sheets.

9. The apparatus for controlling an opening hole according to claim 1, wherein the plurality of perforations have the same size and shape and are parallel to each other, the size of the block sheets in the first state corresponds to the size of the perforations.

10. The apparatus for controlling an opening hole according to claim 1, wherein the apparatus for controlling an opening hole further comprises a paste film layer for pasting the outer frame to the case of the electronic equipment.

11. An apparatus for controlling an opening hole, the apparatus configured to be used with a case of an electronic equipment, the case has an accommodation space, wherein the apparatus for controlling an opening hole comprises:
movable block sheets disposed in an accommodation space, having a first state in which a port for communication between the accommodation space and the outside is closed and a second state in which the port for communication is opened;
a drive mechanism, configured to control the block sheets to switch between the first state in which the port for communication is closed and the second state in which the port for communication is opened;
an outer frame having a plurality of perforations; and
a slider connected to the outer frame and configured to translate with respect to the other frame,
wherein the block sheets are disposed on the slider, when the slider is in a first position with respect to the outer frame, the block sheets are in the first state, each of the block sheets correspondingly blocks one perforation; when the slider moves from the first position to a second position with respect to the outer frame, the block sheets are driven to move from the first state to the second state, so that the perforations are exposed;
wherein the slider comprises two guide grooves parallel to each other and a connect rod connected with the two guide grooves, wherein the two guide grooves and the connect rod are in a shape of "Π", and the two guide grooves are correspondingly disposed on two opposing sides of the outer frame, the perforations are disposed between the two guide grooves; and a tooth rail is disposed on one surface of the guide grooves along a length direction of the guide grooves;
wherein two sides of the block sheets are connected to a positioning rod and a scroll respectively, the positioning rod is fixedly disposed on the guide grooves, the outer surface of the scroll is in a tooth shape, and the scroll is connected with the tooth rail in cooperation;
wherein the slider is translated along the length direction of the guide grooves, and moves between the first position and the second position, such that the scroll is driven to scroll on the rail and switch between the first state and the second state.

12. The apparatus for controlling an opening hole according to claim 11, the drive mechanism comprises an electrically driven mechanism and a revert structure, wherein the apparatus for controlling an opening hole further comprises:
a power supply interface, connected to a power source and configured to supply power to the electrically driven mechanism when that the power source is on, so that the electrically driven mechanism drives the block sheets to move from the first state in which the port for communication is closed to the second state in which the port for communication is opened;
wherein the revert structure is configured to generate an acting force to enable the block sheets to revert to the first state when the power source is off.

13. An electronic equipment, wherein a case of the electronic equipment is provided with meshes penetrating the case, and an apparatus for controlling an opening hole is disposed on one side of the meshes,
wherein the apparatus for controlling an opening hole comprises:
movable block sheets;
a drive mechanism, configured to control the block sheets to switch between a first state in which the meshes are blocked and a second state in which the meshes are exposed;
an outer frame having a plurality of perforations; and
a slider connected to the outer frame and configured to translate with respect to the outer frame,
wherein the block sheets are disposed on the slider, when the slider is in a first position with respect to the outer frame, the block sheets are in the first state, each of the block sheets correspondingly blocks one perforation; when the slider moves from the first position to a second position with respect to the outer frame, the block sheets are driven to move from the first state to the second state, so that the perforations are exposed;

wherein the slider comprises two guide grooves parallel to each other and a connect rod connected with the two guide grooves, wherein the two guide grooves and the connect rod are in a shape of "Π", and the two guide grooves are correspondingly disposed on two opposing sides of the outer frame, the perforations are disposed between the two guide grooves; and a tooth rail is disposed on one surface of the guide grooves along a length direction of the guide grooves;

wherein two sides of the block sheets are connected to a positioning rod and a scroll respectively, the positioning rod is fixedly disposed on the guide grooves, the outer surface of the scroll is in a tooth shape, and the scroll is connected with the tooth rail in cooperation;

wherein the slider is translated along the length direction of the guide grooves, and moves between the first position and the second position, such that the scroll is driven to scroll on the rail and switch between the first state and the second state.

* * * * *